United States Patent
Saitou et al.

(10) Patent No.: US 9,496,869 B2
(45) Date of Patent: Nov. 15, 2016

(54) SLAVE STATION

(75) Inventors: Yoshitane Saitou, Kyoto (JP); Kenji Nishikido, Kyoto (JP)

(73) Assignee: ANYWIRE CORPORATION, Kyoto (JP)

( * ) Notice: Subject to any disclaimer, the term of this patent is extended or adjusted under 35 U.S.C. 154(b) by 429 days.

(21) Appl. No.: 14/115,154

(22) PCT Filed: May 3, 2011

(86) PCT No.: PCT/JP2011/060563
§ 371 (c)(1),
(2), (4) Date: Nov. 1, 2013

(87) PCT Pub. No.: WO2012/150638
PCT Pub. Date: Nov. 8, 2012

(65) Prior Publication Data
US 2014/0062219 A1    Mar. 6, 2014

(51) Int. Cl.
*H03K 17/965* (2006.01)

(52) U.S. Cl.
CPC .......... *H03K 17/965* (2013.01); *Y10T 307/766* (2015.04)

(58) Field of Classification Search
CPC .................................. G05F 1/10; B60R 16/03
USPC ........................................... 307/116; 361/139
See application file for complete search history.

(56) References Cited

U.S. PATENT DOCUMENTS

2010/0171026 A1* 7/2010 Saitou .................. H03K 17/968
250/221

FOREIGN PATENT DOCUMENTS

CN    101784970 A  *  7/2010  ......... G05B 19/4185
JP    45-017076 Y1    7/1970

(Continued)

OTHER PUBLICATIONS

Machine translation of N above.*

(Continued)

*Primary Examiner* — Rexford Barnie
*Assistant Examiner* — Elim Ortiz
(74) *Attorney, Agent, or Firm* — Pearne & Gordon LLP

(57) ABSTRACT

An object of the present invention is to provide a slave station that may not deteriorate even when a switch is placed in a vertical direction and that may replace only the worn switch with new one in low costs thereby having user-friendliness. The slave station according to the present invention comprises the switch. The switch comprising a flexible cylindrical member bendable in any directions and the flexible cylindrical member being detachably attached to a housing composed of a body, a rigid rod member attached to a free end of the flexible cylindrical member, a flexible rod member extending from a base end of the rigid rod member toward the base end of the flexible cylindrical member through the inside of the flexible cylindrical member, and a guiding member comprising a insertion opening for inserting and holding the flexible rod member, the guiding member allowing movement in a direction to the shaft line of the flexible cylindrical member. A detecting portion element is formed at the end of the flexible rod member protruded from the opening of the guiding member. The detecting portion element comprises an electrostatic substance and a magnetic metal substance. The detecting portion element comprises a reflective surface on the end surface or a side surface of the flexible rod member.

4 Claims, 13 Drawing Sheets

(56) References Cited

FOREIGN PATENT DOCUMENTS

| | | |
|---|---|---|
| JP | 49-101869 A | 9/1974 |
| JP | 2-57633 U | 4/1990 |
| JP | 2009-026509 A | 2/2009 |
| JP | 2010-123320 A | 6/2010 |
| JP | 2010-254399 A | 11/2010 |
| WO | 2009/028008 A1 | 3/2009 |

OTHER PUBLICATIONS

Chinese Office action for Application No. 201180025030.2 dated May 22, 2015.
International Search Report for Application No. PCT/JP2011/060563 dated Aug. 9, 2011.
Korean Office action for Application No. 10-2012-7026936 dated Dec. 16, 2013.

* cited by examiner

SLAVE STATION

BACKGROUND OF THE INVENTION

1. Field of the Invention

The present invention relates to a slave station receiving a control signal from a control section and transmitting a monitoring signal thereto via common data signal lines. A plurality of slave stations are connected in parallel to the common data signal lines, and a master station in the control section is connected to the common data signal lines.

2. Description of the Related Art

A picking system may control directions for an operation of receiving a necessary component to assemble a product from components stored in a storage rack, and for an operation of resupplying a component to the storage rack. In the picking system, a slave station terminal is used for the directions for receiving and resupplying a component. More specifically, the slave station can show that a component is stored in the storage rack and comprises an input device for notification information indicating that the component has been taken out. The slave station is arranged on each of a plurality of storage racks. The slave stations are connected to a main computer via a control unit. The main computer transmits a direction for receiving a component to the control unit. The control unit activates a lamp or an indicator provided to the storage rack on which the component to be received is placed to show the receiving direction. An operator who completes the receipt of the specified component operates a switch lever on the slave station in order to input the completion. The operation signal is received by the main computer via the control unit to monitor the process, prevent mistakes, resupply a component to the storage rack, as well as to control the number of stocks and order the supplies.

The switch lever of the slave station used by the picking system is preferably a switch lever tiltable to any directions considering user-friendliness. A variety of techniques have been proposed to improve the operability of the switch lever. The inventors proposed a contactless ON/OFF switch disclosed in JP2009-26509A. The contactless ON/OFF switch comprises a switch lever that is excellent in user-friendliness. The contactless ON/OFF switch comprises a cylindrical member that has flexibility and stretchability and thus may be freely restored to the normal position. The contactless ON/OFF switch also comprises a base member and a rod member that has flexibility. A first end of the cylindrical member is fixed to the base member. The rod member is inserted into the cylindrical member. A first end of the rod member is fixed to an end portion of the cylindrical member that is not fixed to the base member. A second end of the rod member is protruded from the cylindrical member. When a bending force is applied to the free end (the end portion fixed to the first end of the rod member) of the cylindrical member, the cylindrical member and the rod member are bent. As a result, the end portion (the moving end portion) of the rod member protruded from the cylindrical member is moved toward the free end along the shaft line of the rod member or is tilted from the shaft line. The movement of the moving end portion of the rod member is the same regardless of the direction of the bending force applied to the free end. Thus, if the movement of the end portion is converted to electrical signal binary and is output, the same output can be obtained independent of the direction in which the free end is bent, that is, the ON/OFF operation can be provided.

The inventors further proposed a structure of a switch lever for a contactless ON/OFF switch, the structure being disclosed in JP2010-123320A. The structure of the switch lever comprises a cylindrical member that has flexibility and stretchability and thus may be freely restored to the normal position. A first end of a rod member is inserted into the cylindrical member and fixed therein. A mirror surface is formed at an end of the rod member that is surrounded by the cylindrical member. A detecting portion is opposed to the mirror surface. The amount of light on a light-receiving element is changed by a slant of the mirror surface formed at the end of the rod member. The detecting portion detects the change based on the amount of light received by the light-receiving element during startup. Namely, the detecting portion resets the standard detection level at every startup. This reduces the affect of the aged deterioration of the mirror surface, thereby improving the durability of the switch lever. The structure can thus keep the operability that the switch lever can be tilted in any directions, while decreasing the frequency of breakdowns and thus decreasing care and costs required for maintenance.

Patent Literature 1: JP2009-26509A
Patent Literature 2: JP2010-123320A

SUMMARY OF THE INVENTION

The switch lever of the slave station is preferably placed in the vertical direction from the body of the slave station when considering user-friendliness. Unfortunately, if the switch lever structure is applied to the slave station, the structure has a problem that when the rod member is placed in the vertical direction, the detection sensitivity of the detecting portion is decreased or the detecting portion does not function due to dust accumulated on the mirror surface, the dust being induced from the room above the mirror surface. On the other hand, in the contactless ON/OFF switch in which one end of the rod member is inserted into the cylindrical member and is protruded therefrom and the movement of the protruded end is converted to electrical signal binary and is output, the aforementioned problem may be avoided. Further, because various embodiments can be applied to the structure for converting the movement of the protruded end to electrical signal binary (hereinafter referred to as an end portion detecting structure), the end portion detecting structure can arbitrarily adopt an embodiment suitable for the usage environment of the slave station.

However, the cylindrical member having flexibility is repeatedly deformed. Thus, replacement of the cylindrical member is necessary if the cylindrical member is worn after being used for a certain amount of time. In order for the slave station to function, a setup for data transmission and receiving between the slave station and the control section is needed. Therefore, replacement of the whole slave station requires time and effort. On the other hand, a device such as a circuit device inside the slave station is less worn than the cylindrical member. Accordingly, the replacement of the whole slave station caused by the wear damage of only the switch lever in the slave station is not economical or feasible.

Thus, an object of the present invention is to provide a slave station in which only a switch portion may be replaced at low cost that does not cause disadvantage even when the switch portion is placed in a vertical direction and that has user-friendliness.

A slave station according to the present invention comprises a transmission device extracting control data from a transmission signal on common data signal lines connected to a control section, the transmission device transmitting a monitoring data signal to the common data signal lines; an indicating device; an input device; and an input-output device transmitting and receiving data to and from the indicating device. The input device comprises a switch portion and a detecting portion. The switch portion comprises a flexible cylindrical member bendable in any directions, the flexible cylindrical member being detachably attached to a housing forming a body, the housing comprising the transmission device, the input-output device, and the detection portion; a rigid rod member attached to a free end of the flexible cylindrical member; a flexible rod member extending from the base end of the rigid rod member toward the base end of the flexible cylindrical member through the inside of the flexible cylindrical member; and a guiding member comprising an insertion opening for the flexible cylindrical member, the guiding member holding the flexible cylindrical member while allowing for movement of the flexible cylindrical member in the shaft line direction. A detection element is formed at the end portion of the flexible rod member protruded from the insertion opening of the guiding member. The detection element comprises an electrostatic substance and a magnetic metal substance. The detection element comprises a reflective surface on the end surface in the shaft line direction or a side surface parallel to the shaft line. The detection portion detects the detection element moving away therefrom when a force is applied to the rigid rod member in a direction perpendicular to the shaft line of the rigid rod member and the flexible rod member moves in the shaft line direction.

In the present invention, the detection element may comprise a magnetic substance if, for example, the detecting portion comprises a magnetic sensor and detects the ON/OFF switch operation using the change of the magnetic force. If the detecting portion comprises a light-emitting element and a light-receiving element and detects the ON/OFF switch operation using the change of the amount of light, the detection element may comprise a light reflecting material. Likewise, if the detecting portion comprises an ultrasonic wave-emitting element and an ultrasonic wave-receiving element and detects the ON/OFF switch operation using the change of the sound volume, the detection element may comprise a sound reflecting material. Further, if the detecting portion detects the ON/OFF switch operation based on the change in inductance (L), the detection element may comprise a metal. If the detecting portion detects the ON/OFF switch operation based on the change in capacitance (C), the detection element may comprise an electrostatic substance. However, if the detection element comprises a reflective surface and comprises an electrostatic substance and a magnetic metal substance, any detecting portions may be used regardless of the detection method.

The detecting portion may be opposed to the end surface or the side surface of the detection element.

The transmission device transmits via the common data signal lines transmit a starting signal followed by a successive pulse signal. Address data is assigned to the pulse signal serially for each cycle of the signal. The transmission device may count the address data from the starting signal as the starting point. When the address data corresponds to self-address data, the transmission device may extract control data overlapped on the successive pulse signal and transmit the monitoring data signal to the common data signal lines.

The switch portion in the slave station according to the present invention has excellent operability since the switch portion may be bent in any directions. When a force is applied to the rigid rod member in a direction perpendicular to the shaft line of the rigid rod member, the flexible rod member moves in the shaft line direction and the detecting portion detects the detection element moving away therefrom as an operation of the switch portion. Therefore, the slave station may not cause disadvantage due to accumulation of dusts or the like even when the switch portion is placed in a vertical direction. Further, the flexible cylindrical member in the switch portion may be detachably attached to a housing forming a body of the slave station. The flexible cylindrical member may thus be detached from the housing to integrally detach the rigid rod member, the flexible rod member, and the guiding member in the switch portion from the housing. Conversely, the flexible cylindrical member may be attached to the housing to integrally attach the rigid rod member, the flexible rod member, and the guiding member to the housing. Namely, the whole switch portion is easily replaceable. Furthermore, since the detection element has a reflective surface and comprises an electrostatic substance and a magnetic metal substance, any detecting portions using a magnetic force, an amount of light, a sound volume, an inductance (L) or capacitance (C) are available. Accordingly, the detecting portion is replaceable regardless of the detection principle.

The location of the detecting portion may be arbitrarily determined based on the relation with other circuit devices placed in the slave station or the usage pattern of the slave station. For instance, the detecting portion is preferably opposed to the end surface of the detection element in order to make the replacement easier. In this case, a circuit board and the detection element are not crossed. Thus, the switch portion is easily replaceable from the housing. In order to enhance the detection sensitivity of the detecting portion, the detecting portion is preferably opposed to the side surface of the detection element. In this case, the detection element moves out of a region where the detection element faces to the detecting portion when the flexible rod member moves in the shaft line direction, while in a region where the detection element faces to the detecting portion, a part of the side surface of the detection element is located at a constant distance from the detecting portion. Namely, the detection method has more excellent sensitivity than the detection method on the basis of the change of the length between the detecting portion and the detection element since the detecting portion may detect the existence or absence of the detection element in a predetermined region.

Figure 1:
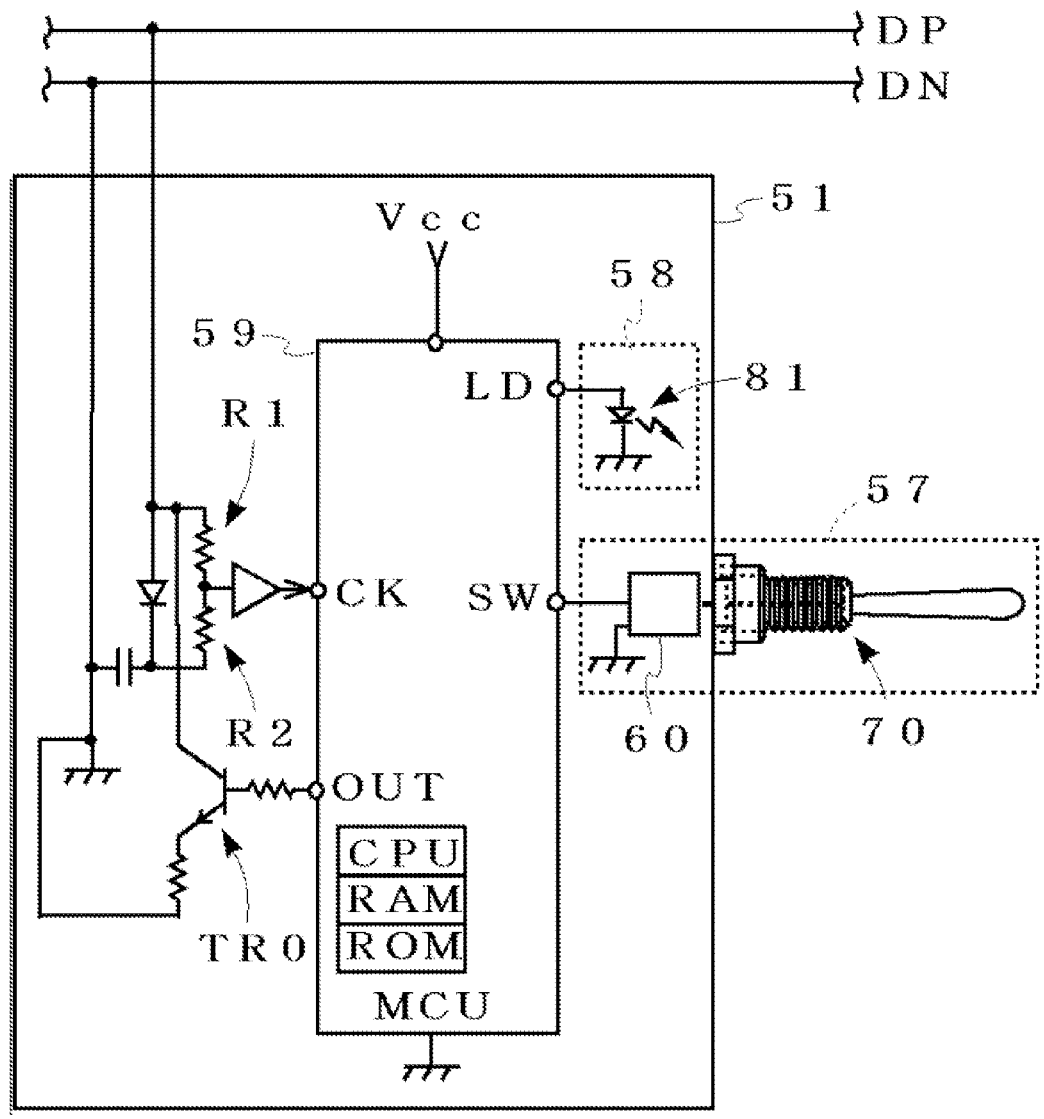
FIG. 1 is a hardware configuration diagram of an embodiment of a slave station according to the present invention.

Embodiments of a slave station of the present invention are described referring to FIGS. 1 to 14. A slave station 5 is used in an article picking-up management system shown in FIG. 3. The slave station 5 is fixed to a pipe rack 10 in a shelf for accommodating an article as shown in FIG. 2. Under the slave station 5, there is a recess to accommodate an article. A direction for picking up an article in the recess is issued by lighting of a direction lamp 81. When an operator finishing picking the article up operates a switch lever 71, which corresponds to a rigid rod member of the present invention, corresponding information is transmitted to a control unit. Since the switch lever 71 may be tilted in any directions, the operator may tilt it very easily and smoothly after picking the article up.

The control unit 1 is, for example, a programmable controller or a computer. The control unit 1 includes an output unit 11 and an input unit 12, which are connected to a master station 2. The output unit 11 outputs control data 13 for the slave station 5. The input unit 12 receives monitoring data 14 showing whether the switch lever in the slave station 5 is operated or not.

Figure 4:
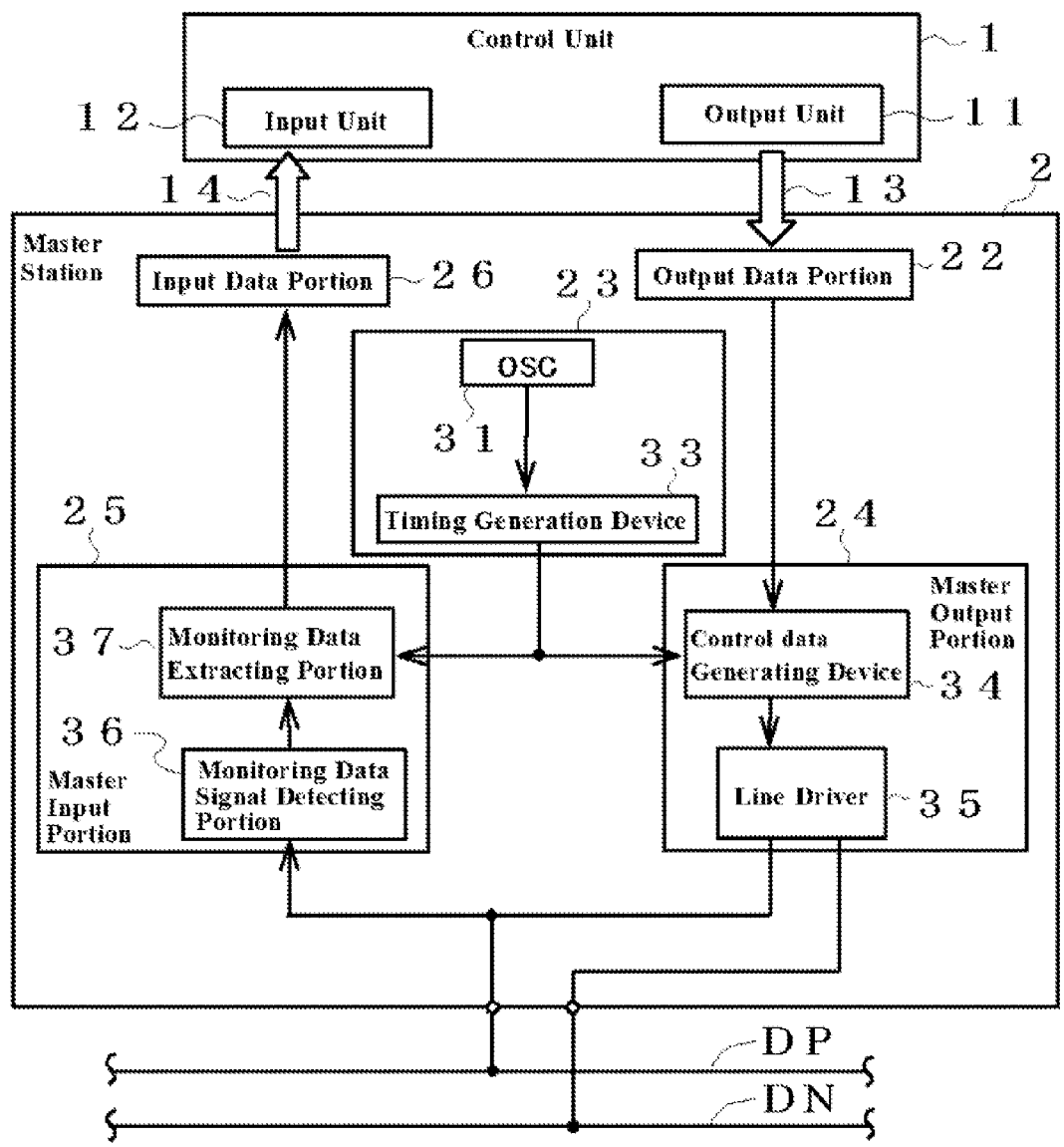
FIG. 4 is a Nock diagram showing a function of a control unit and a master station in the article picking-up management system.

The master station 2 comprises an output data portion 22, a timing generation portion 23, a master output portion 24, a master input portion 25, and an input data portion 26 as shown in FIG. 4. The master station 2 is connected to common data signal lines DP and DN. The master station 2 transmits a control data signal as a successive pulse (hereinafter referred to as a transmission clock signal 20) to the common data signal lines DP and DN. The master station 2 also converts a monitoring data signal 50 transmitted from the slave station 5 to parallel data and then transmits the parallel data to the input unit 12 in the control unit 1 as monitoring data 14.

The output data portion 22 transmits parallel data as serial data received as control data 13 from the output unit 11 in the control unit 1 to the master output portion 24.

The timing generation portion 23 comprises an oscillation circuit (OSC) 31 and a timing generation device 33. The timing generation device 33 generates a timing clock of the system based on the OSC 31 and then transmits the timing clock to the master output portion 24.

The master output portion 24 comprises a control data generating device 34 and a line driver 35. The master output portion 24 outputs a transmission clock signal 20 as a successive pulse signal to the common data signal lines DP and DN via the line driver 35 based on data received from the output data portion 22 and the timing clock received from the timing generation portion 23.

When parallel data is received as the control data 13 from the output unit 11 in the control unit 1, data value in the control data 13 is expressed by a pulse width of a period of a high voltage in one cycle of the transmission clock signal 20. The transmission clock signal 20 has a high potential such as +24V in the second half of one cycle and a low potential such as 0V or +12V in the first half of one cycle. The width of the high potential is expanded depending on each data value of the control data 13 inputted from the control unit 1. For instance, the width of the high potential is expanded to (3/4(t0)), where t(0) denotes one cycle of the transmission clock signal 20.

The data value (the control data) of the transmission clock signal 20 transmitted to the common data signal lines DP and DN from the master output portion 24 is assigned with address data serially for each cycle of the transmission clock signal 20. In addition, the beginning signal of the transmission clock signal 20 forms the starting signal (the start bit) to count address data. The start bit may be, for example, a signal longer than the width of one cycle of the transmission clock signal 20 as well as have a potential level equal to the high potential level of the transmission clock signal 20.

The master input portion 25 comprises a monitoring data signal detecting portion 36 and a monitoring data extracting portion 37. The master input portion 25 transmits serial input data to the input data portion 26. The monitoring data signal detecting portion 36 detects a monitoring data signal 50 transmitted from the slave station 5 via the common data signal lines DP and DN. The data value of the monitoring data signal 50 transmitted from the slave station 5 is presented by the potential in the first half (the low potential period) of one cycle of the transmission clock signal. After the start bit is transmitted, the monitoring data signal 50 is received serially from each slave station 5. Data of the monitoring data signal 50 is extracted by the monitoring data extracting portion 37 in synchronization with a signal generated from the timing generation device 33. The extracted data is transmitted to the input data portion 26 as serial input data. The input data portion 26 converts the serial input data received from the master input portion 25 into parallel data and then transmits the converted data to the input unit 12 in the control unit 1 as monitoring data 14.

Figure 3:
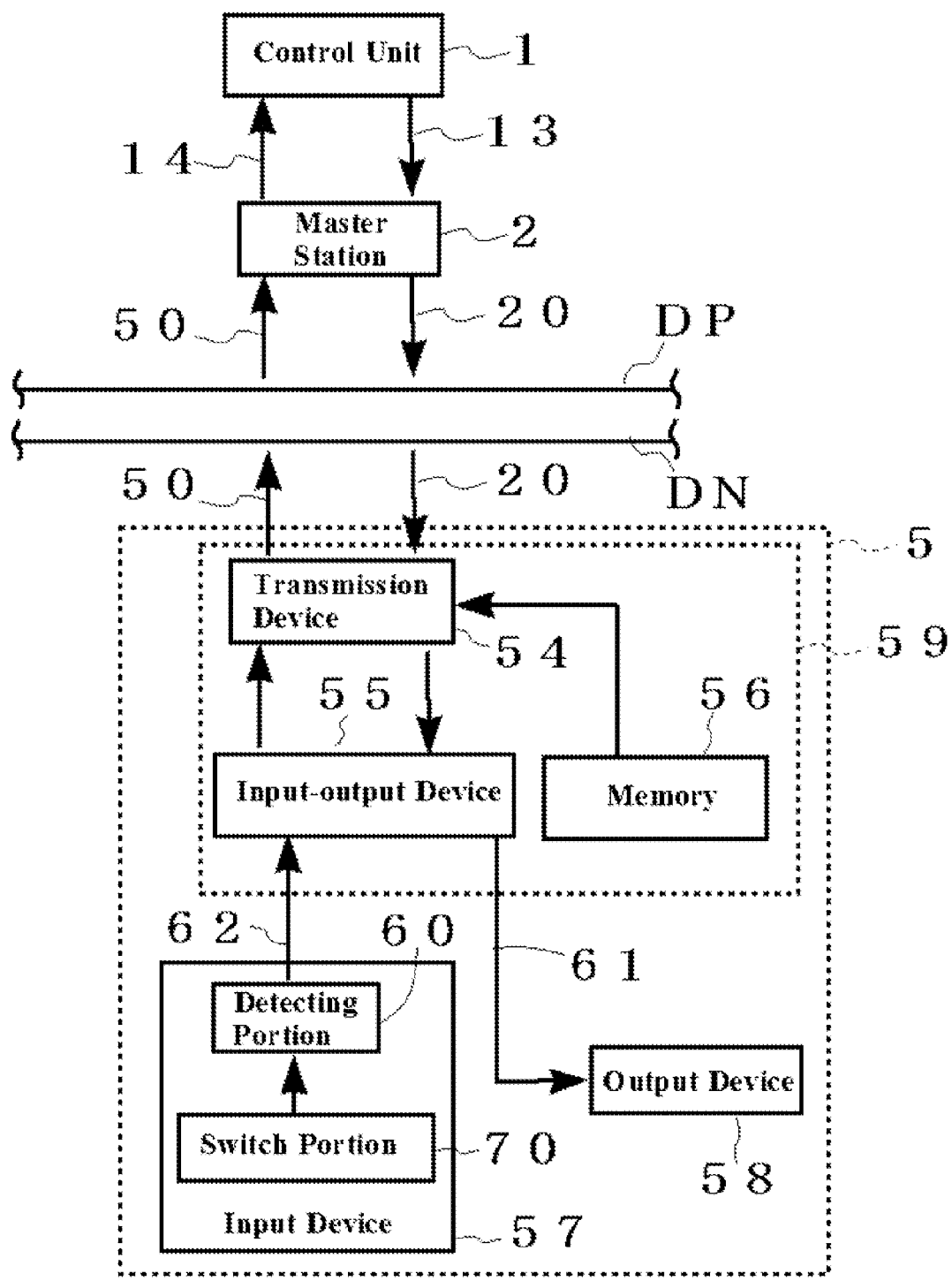
FIG. 3 is a Nock diagram showing a function of the slave station in an article picking-up management system.

The slave station 5 comprises a transmission device 54, an input-output device 55, a memory 56, an input device 57, and an output device 58 as shown in FIG. 3. The slave station 5 is connected to the common data signal lines DP and DN. The slave station 5 shows a direction for picking up an article on the basis of the control data in the transmission clock signal 20 as well as transmits a monitoring data signal showing whether the switch lever is operated in order to indicate the completion of the pickup. In the slave station 5, a micro-computer control unit (MCU) 59 functions as the transmission device 54, the input-output device 55, and the memory 56.

The input device 57 comprises a detecting portion 60 and a switch portion 70. The input device 57 is connected to an input terminal SW of the MCU 59. The output device 58 comprises the direction lamp 81 and is connected to an output terminal LD of the MCU 59.

Figure 2:
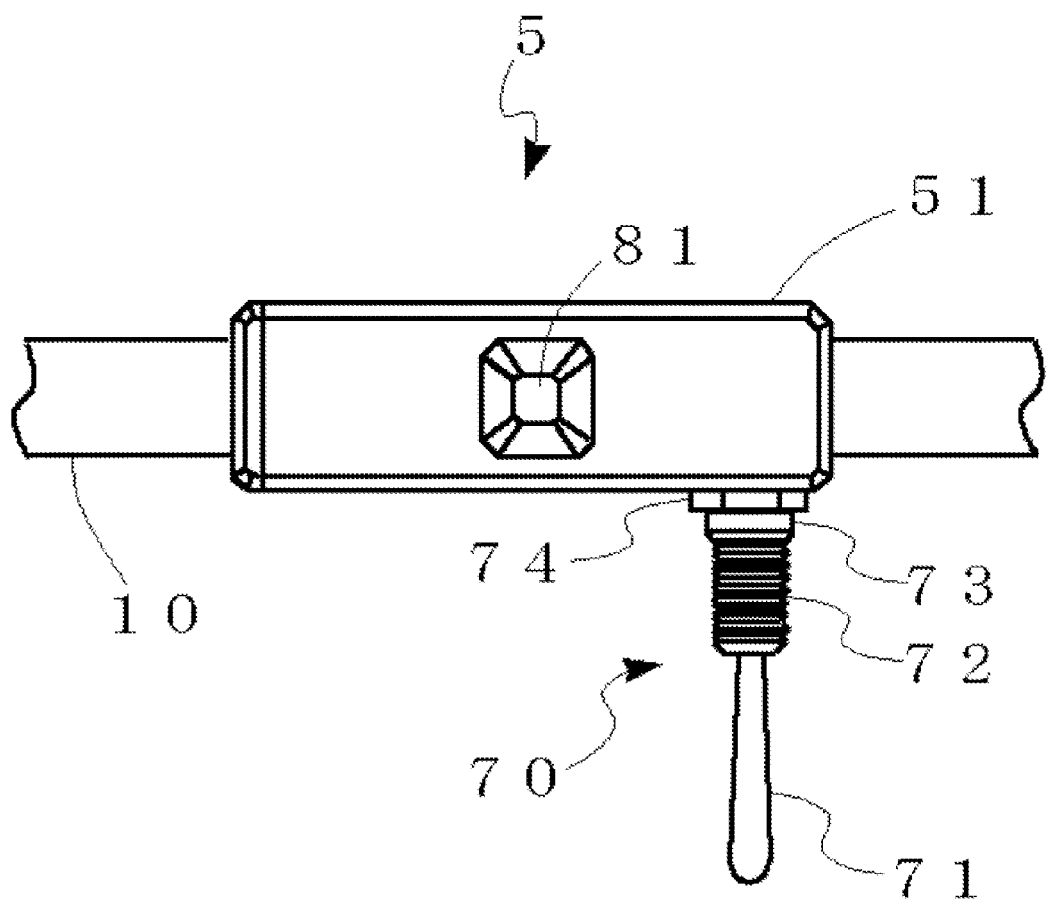
FIG. 2 is an elevation view showing the slave station.
Figure 7:
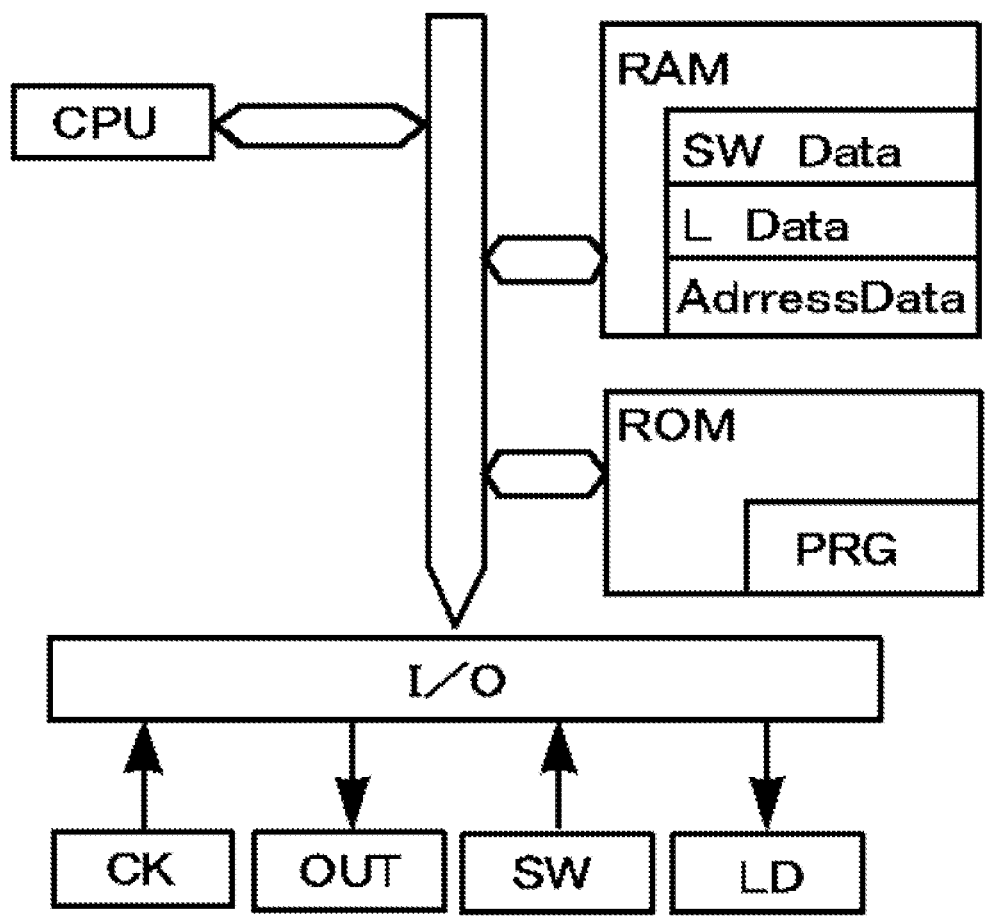
FIG. 7 is a system Nock diagram of the slave station.

MCU 59 comprises a CPU, a RAM and a ROM as shown in FIGS. 1 and 7. The ROM memorizes a program (PRG) to serve a function necessary for the article picking-up management. The RAM memorizes SW data on the basis of an input signal from the input terminal SW, L data for outputting a direction signal from the output terminal LD, and address data. In the CPU, the calculation function is used to perform processes to serve the necessary functions. The address data memorized in the RAM is the self-address corresponding to any of the addresses assigned to the transmission clock signal. The self-address may be memorized externally using the control unit 1 or a not-shown independent terminal. Further, the self-address may be memorized in a FROM (non-volatile rewritable memory) in advance in manufacturing the slave station 5 and may be read during startup.

A divided signal is obtained by dividing the potential difference between the common data signal lines DP and DN with divider resistors R1 and R2. The divided signal is input from an input terminal CK to the MCU 59. In addition, an out signal for transmitting SW data to the common data signal lines DP and DN as monitoring data is output from an out terminal OUT.

The MCU 59 obtains, in the normal usage state in the article picking-up management system, transmission address data by always counting the cycle of the transmission clock signal from the starting signal as the starting point. If the transmission address data corresponds to the self-address data memorized in the RAM, a signal corresponding to the SW data memorized in the RAM in the MCU 59 is output from the output terminal OUT to the base of a transistor TR0. More specifically, if the SW data shows "on", that is, the switch lever 71 is operated, the transistor TR0 will turn "on". On the contrary, if the SW data shows "off", that is, the switch lever 71 is not operated, the transistor TR0 is "off". If the SW data shows "on", that is, the switch lever 71 is operated, the transistor TR0 conducts "on" current, thereby dropping the voltage. When the voltage level reaches roughly 0V, the signal thereof is transmitted to the common data signal lines DP and DN. If the SW data shows "off", that is, the switch lever 71 is not operated, the transistor TR0 has "off" current, thereby not dropping the voltage. Thus, the voltage level is roughly 12V, and the signal thereof is transmitted to the common data signal lines DP and DN. Namely, the monitoring signal transmitted to the common data signal lines DP and DN is the transmission clock signal having a reduced voltage in the low voltage period in one cycle thereof. If the transmission address data is not the self-address data, the MCU 59 counts the cycle and increments the address data until the transmission address data corresponds to the self-address data.

When the transmission address data corresponds to the self-address data, the MCU 59 extracts the control data for the self-address overlapped on the transmission clock signal 20. In line with the control data, the MCU 59 outputs an electrical current signal from the output terminal LD for the direction lamp 81 to the output device 58 as an output signal 61. The direction lamp 81 lights up or down depending on the electrical current signal from the output terminal LD. After an operator receives an article according to the direction, the completion thereof is reported by operating the switch lever 71. When the switch lever 71 is operated, the input signal 62 is input to the MCU 59 from the input device 57 via the input terminal SW. The MCU 59 memorizes the SW data "on" in the RAM on the basis of the input signal 62. When the transmission address data corresponds to the self-address data in the next cycle of the transmission clock signal 20, the transistor TR0 draws "on" current. The resulting signal is transmitted to the common data signal lines DP and DN as the monitoring data signal.

The switch portion 70 is detachable from a casing 51 of the slave station 5. The casing 51 corresponds to the housing according to the present invention. When the switch portion 70 is worn and broken by many operations, the switch portion 70 may be independently exchanged for reuse. In the switch portion 70, a cylindrical connecting member 73 for connecting to the casing 51 has a first end inserted into a not-shown cylindrical projection provided on the casing 51. The cylindrical connecting member 73 may be then fastened to the casing 51 with a hexagon cap nut 74. Hereinafter, one end of the cylindrical connecting member 73 close to the casing 51 is a base end, and the other end is a free end, and the same holds true for other members included in the switch portion 70.

The free end of the cylindrical connecting member 73 is provided with a flexible cylindrical member 72 made of rubber, the flexible cylindrical member 72 having accordion-like pleats. The free end of the flexible cylindrical member 72 is provided with the base end of the switch lever 71. The base end of the switch lever 71 is inserted into the flexible cylindrical member 72, and a flexible rod member 75 extends therefrom toward the base end of the flexible cylindrical member 72 through the inside of the flexible cylindrical member 72. The base end of the flexible rod member 75 is inserted into an insertion opening in a guiding member 76 by which the flexible rod member 75 is supported so as to freely move in the shaft line direction of the flexible rod member. The end of the flexible rod member 75 protruded from the insertion opening is provided with a detection element 77 comprising a magnetic metal substance 77b and an electrostatic substance 77c. An end surface 77a of the detection element 77 is formed as a reflective surface.

With reference to the casing 51, an aperture 52 is formed on the undersurface of the cylindrical projection for receiving the cylindrical connection member 73, and a detecting portion 60 is provided on a circuit substrate 53 placed over the aperture 52 inside the casing 51. The detecting portion 60 is exposed to the aperture 52. When the switch portion 70 is installed to the casing 51, the detection element 77 is closely opposed to the detecting portion 60 in the normal state (shown in FIG. 5A) where the switch lever 71 is not operated.

When a force is applied to the switch lever 71, the flexible cylindrical member 72 is deformed. The deformation changes the switch portion 70 from the state shown in FIG. 5A to the state shown in FIG. 5B where the flexible cylindrical member 72 and the flexible rod member 75 are bent. The end of the flexible rod member 75 protruded from the guiding member 76 moves toward the free end side along the shaft line of the flexible rod member 75 when the switch lever 71 is operated. The detecting portion 60 detects the detection element 77 moving away therefrom whereby the ON/OFF of electrical signals by the switch lever 71 operation may be performed in a contactless manner.

Figure 8:
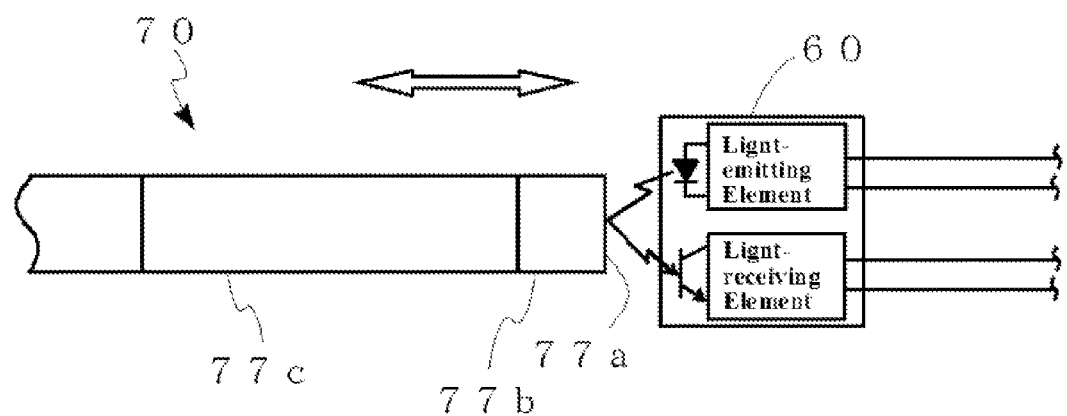
FIG. 8 is a schematic view showing a detection principle on the basis of the change in amount of light.
Figure 9:
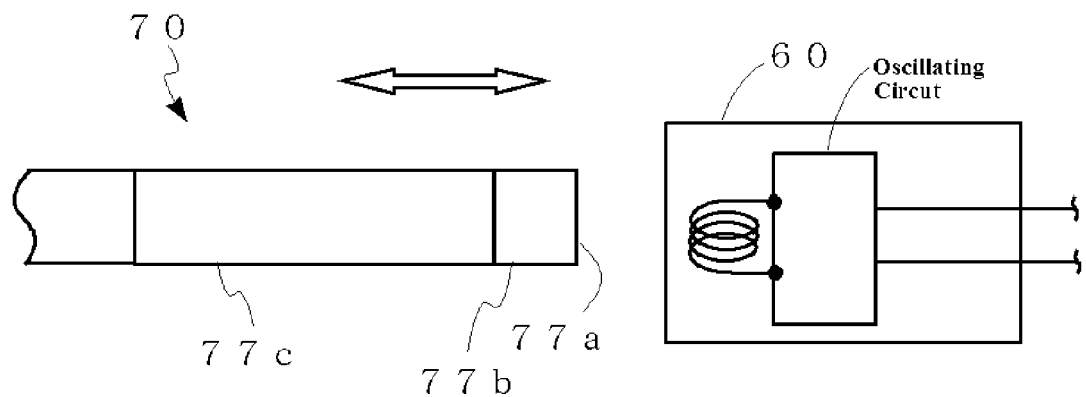
FIG. 9 is a schematic view showing a detection principle on the basis of the change in inductance (L).

The principle of the detecting portion 60 detecting the detection element 77 moving away therefrom is not restricted. Changes of a magnetic force, an amount of light, a sound volume, an inductance (L) and capacitance (C) may be used. More specifically, if the detecting portion 60 comprises a magnetic sensor, the detecting portion 60 may detect the detection element 77 moving away therefrom using the change of a magnetic force from the magnetic metal substance 77b included in the detection element 77. If the detecting portion 60 comprises a light-emitting element and a light-receiving element as shown in FIG. 8, light from the light-emitting element is reflected by the reflective surface 77a of the detection element 77. Therefore, the detecting portion 60 may detect the detection element 77 moving away therefrom using the change of the amount of light received by the light-receiving element. Likewise, although not shown, if the detecting portion 60 comprises an ultrasonic wave-emitting element and an ultrasonic wave-receiving element, ultrasonic waves from the ultrasonic wave-emitting element are reflected by the reflective surface 77a of the detection element 77. Therefore, the detecting portion 60 may detect the detection element 77 moving away therefrom using the change of the amount of ultrasonic waves received by the ultrasonic wave-receiving element. Further, if the detecting portion 60 comprises a proximity sensor as shown in FIG. 9, the detecting portion 60 may detect the detection element 77 moving away therefrom using the change of inductance (L) induced by the magnetic metal substance 77*b* in the detection element 77. Furthermore, although not shown, if the detecting portion 60 comprises a capacitance (C) sensor, the detecting portion 60 may detect the detection element 77 moving away therefrom using the change of capacitance (C) induced by the electrostatic substance 77*c* in the detection element 77.

The component of the flexible cylindrical member 72 is not limited and may be made of any material that is flexible. A synthetic resin may be used. The accordion-like shape may be provided if necessary. The component of the cylindrical connecting member 73 is not limited and may be made of any material that is stiffer than that of the flexible cylindrical member 72. A synthetic resin may be used.

Figure 5A:
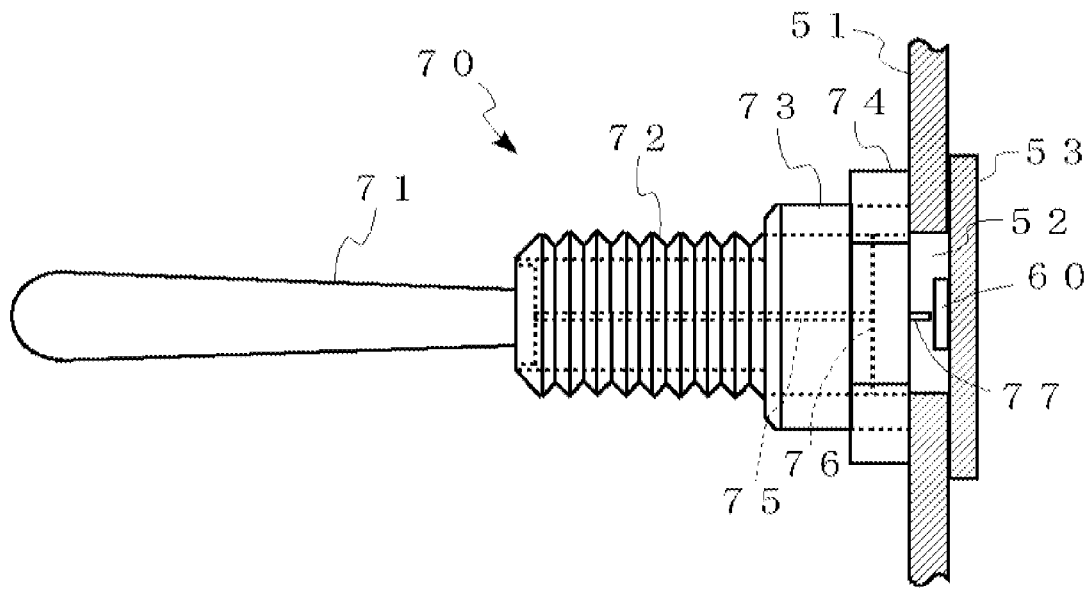
FIG. 5A is a side view showing a switch portion in the slave station in the state of the normal position.
Figure 5B:
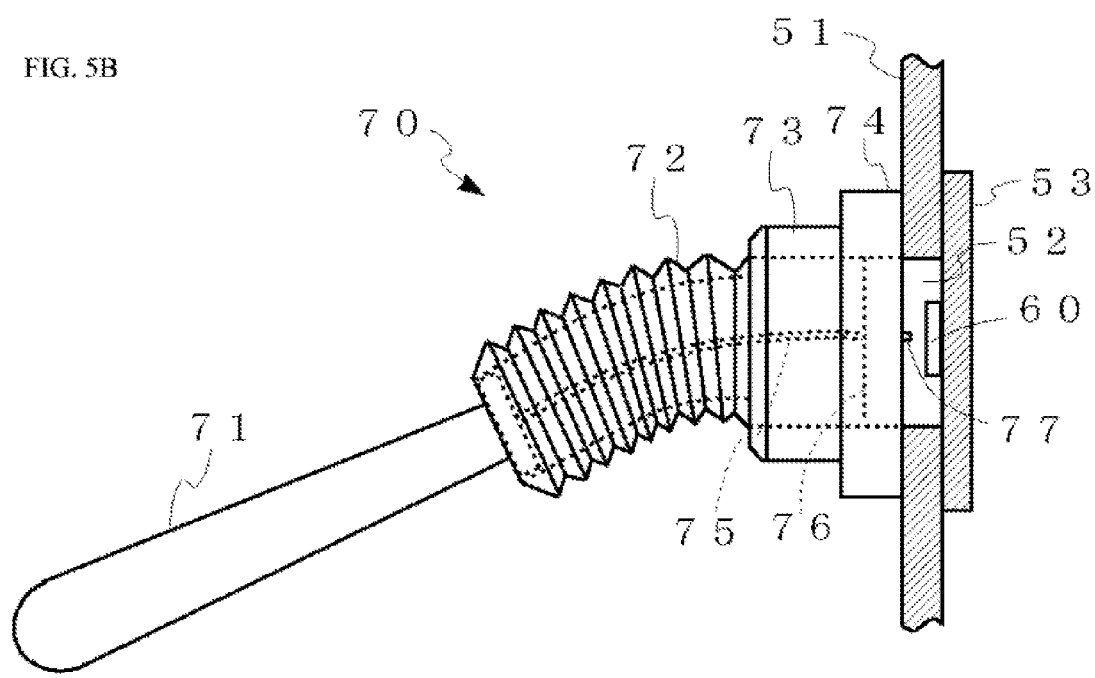
FIG. 5B is a side view showing the switch portion in the slave station in the state where the switch portion is operated.
Figure 6:
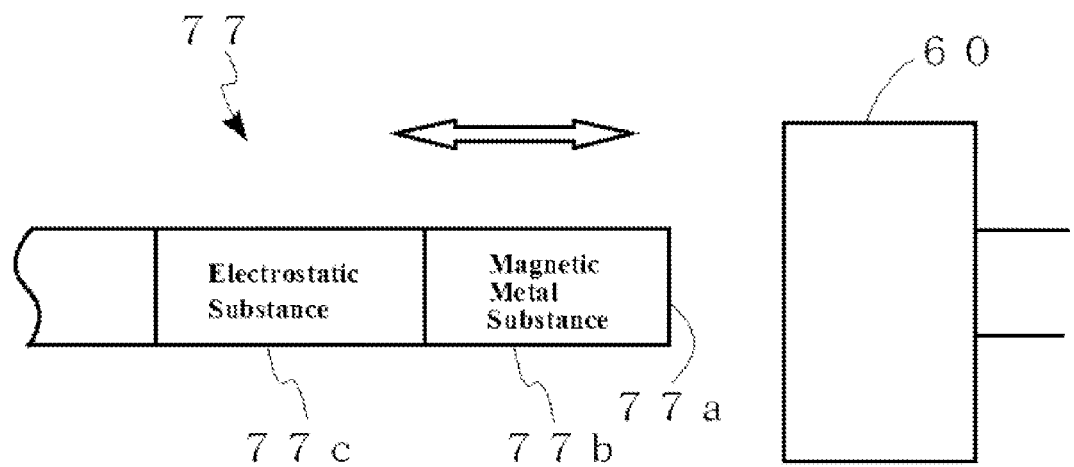
FIG. 6 is an enlarged side view schematically showing a movement of the detection element in FIGS. 5A and 5B.

As shown in FIGS. 5A and 5B, when the detecting portion 60 is opposed to the end surface 77*a* of the detection element 77, the detection element 77 and the circuit substrate 53 are not crossed. Therefore, the switch portion 70 may be easily replaced from the casing 51. If the high detection sensitivity of the detecting portion 60 is required, the detecting portion 60 may be placed facing to the side surface of the detection element 77. FIGS. 10 to 14 show embodiments of the switch portion where the detecting portion is placed facing to the side surface of the detection element. In FIGS. 10 to 14, the components that are substantially identical to those in the embodiment shown in FIGS. 1 to 9 (hereinafter referred to as an embodiment 1) are denoted with the same reference numerals and their explanation is simplified or omitted.

Figure 10A:
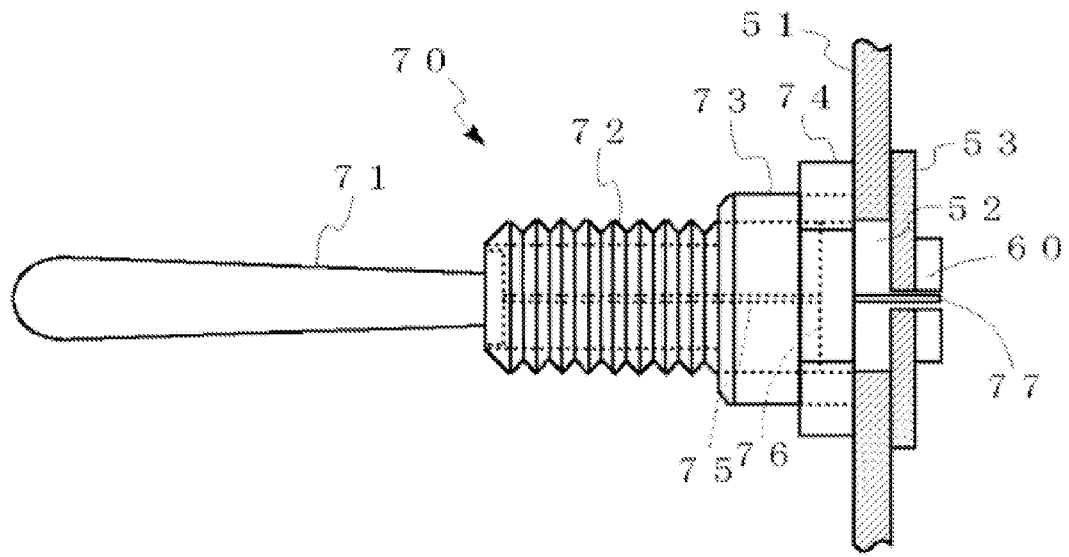
FIG. 10A is a side view showing another embodiment of the switch portion in the slave station in the state of the normal position.
Figure 10B:
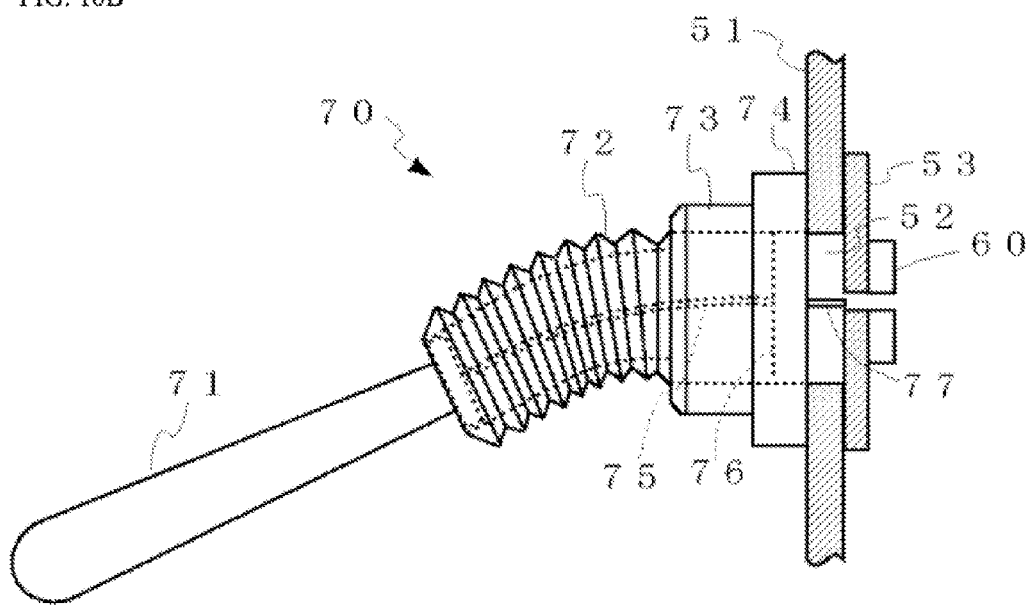
FIG. 10B is a side view showing another embodiment of the switch portion in the slave station in the state where the switch portion is operated.
Figure 11:
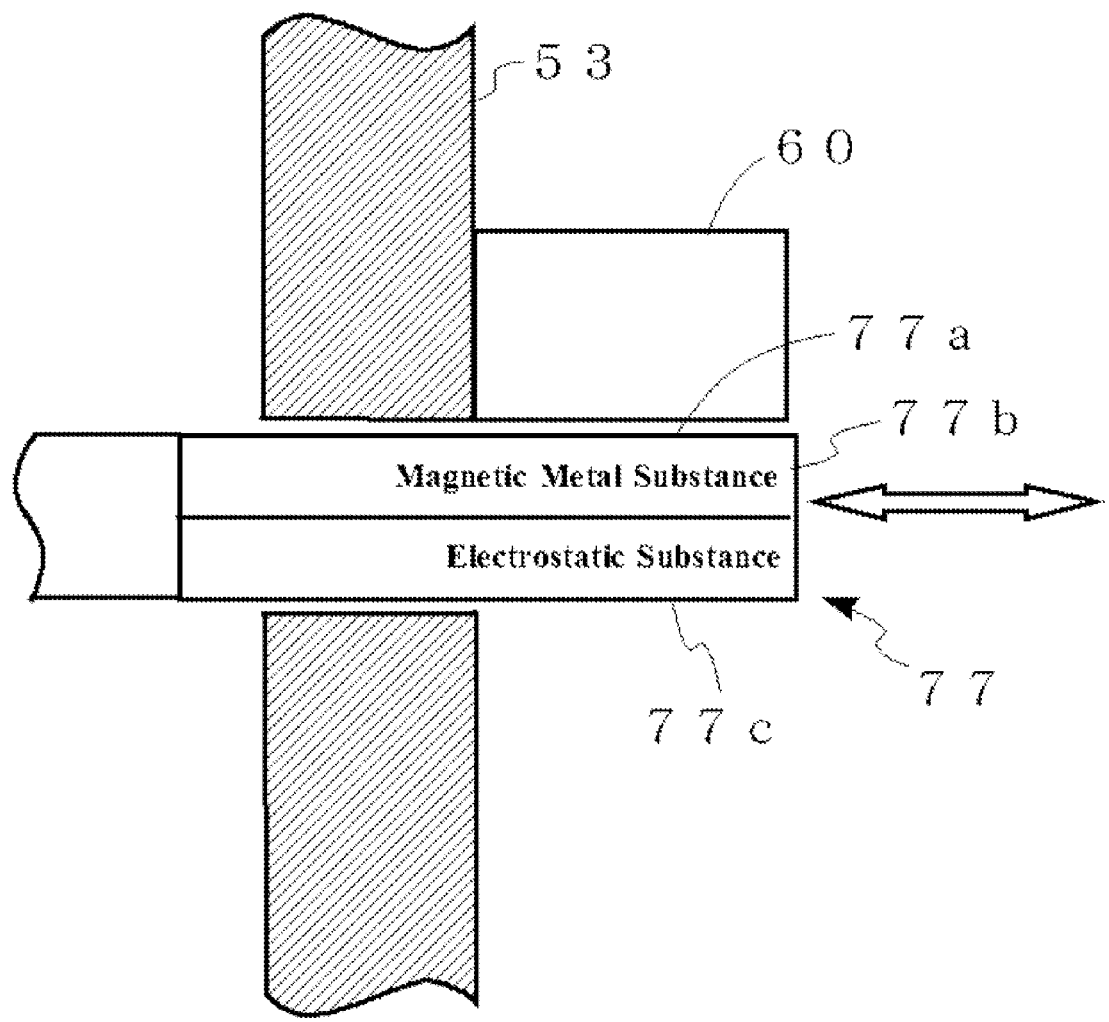
FIG. 11 is a side view schematically showing a movement of the detection element in the switch portion.

In FIGS. 10A and 10B, the circuit substrate 53 has a slit extending from an edge thereof and the detection element 77 is inserted into the slit. In the normal state where the switch lever 71 is not operated as shown in FIG. 10A, the detecting portion 60 is closely opposed to the side surface of the detection element 77. When a force is applied to the switch lever 71, the flexible cylindrical member 72 is deformed. The deformation changes the switch portion 70 from the normal state shown in FIG. 10A to the state shown in FIG. 10B where the flexible cylindrical member 72 and the flexible rod member 75 are bent. The end of the flexible rod member 75 protruded from the guiding member 76 moves toward the free end side along the shaft line of the flexible rod member 75. Then, the detecting portion 60 is not opposed to the side surface of the detection element 77 as shown in FIG. 10B. Therefore, the detecting portion 60 may detect whether or not the detection element 77 is opposed to the detecting portion 60, thereby performing the ON/OFF of electrical signals by the switch lever 71 operation in a contactless manner. The detecting portion 60 detects the detection element 77 in a region where the side surface of the detection element 77 is opposed to the detecting portion 60 at a constant distance. Therefore, the switch portion 70 in an embodiment shown in FIGS. 10A and 10B (hereinafter referred to as an embodiment 2) has superior detection sensitivity to the switch portion 70 in the embodiment 1 in which the switch portion 70 detects the change of the distance between the detecting portion 60 and the detection element 77.

In the embodiment 2, the detection element 77 comprises the magnetic metal substance 77*b* and the electrostatic substance 77*c* like the embodiment 1. However, unlike the embodiment 1 where the magnetic metal substance 77*b* and the electrostatic substance 77*c* are placed adjacent in the axial direction of the detection element 77, the magnetic metal substance 77*b* and the electrostatic substance 77*c* are placed adjacent in a radial direction in the embodiment 2. The detection element 77 shown in FIG. 11 comprises the magnetic metal substance 77*b* which is shown as the upper side of the divided face in FIG. 11 and the electrostatic substance 77*c* which is shown as the lower side of the divided face in FIG. 11. A surface of the magnetic metal substance 77*b* forms the reflective surface 77*a*. The positions of the magnetic metal substance 77*b* and the electrostatic substance 77*c* may be changed appropriately in such a way that the reflective surface 77*a* is formed on the side surface. For example, the electrostatic substance 77*c* extending in the axial direction may be surrounded by the magnetic metal substance 77*b*.

Figure 12:
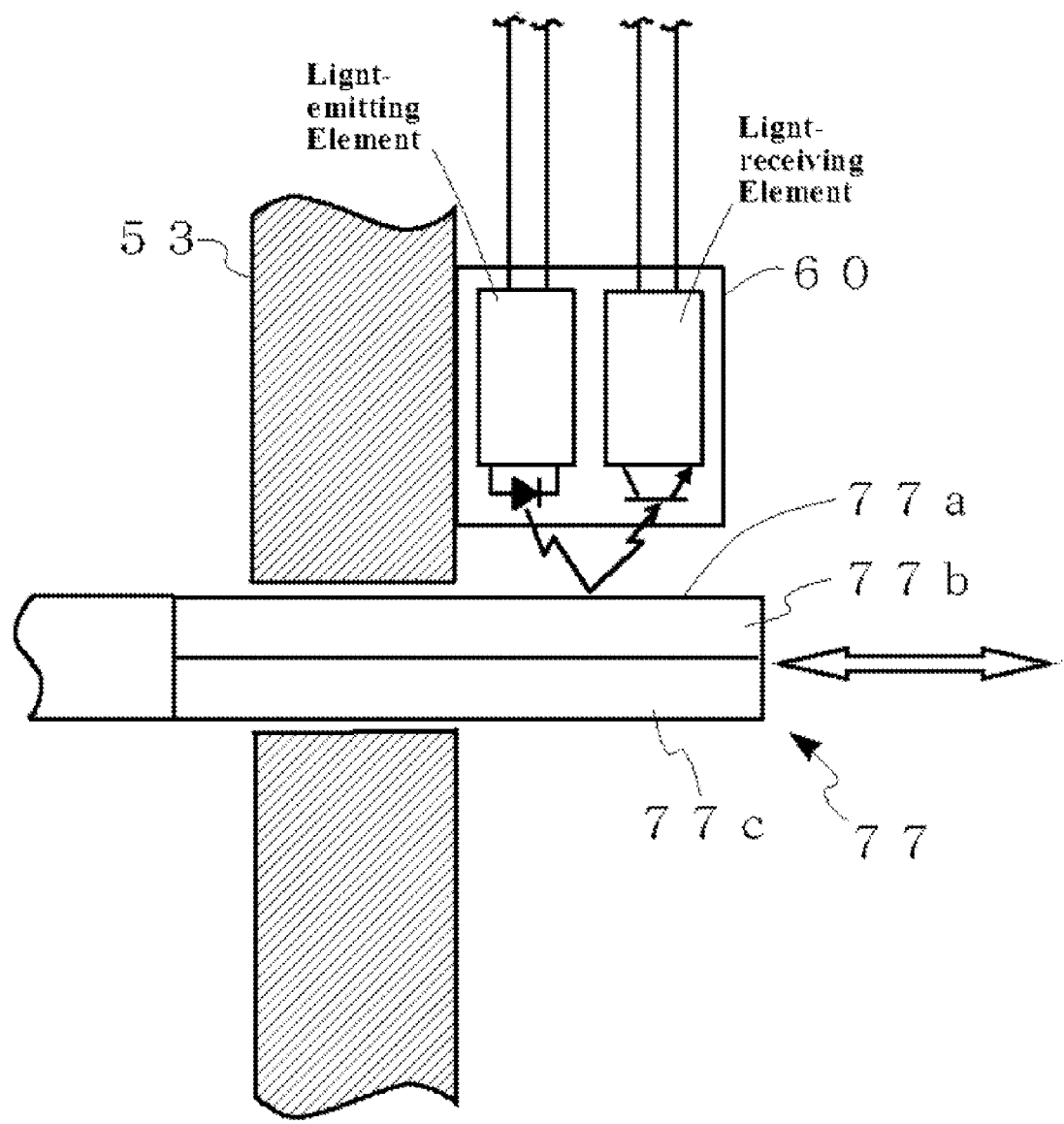
FIG. 12 is a schematic view showing a detection principle on the basis of reflected light.
Figure 13:
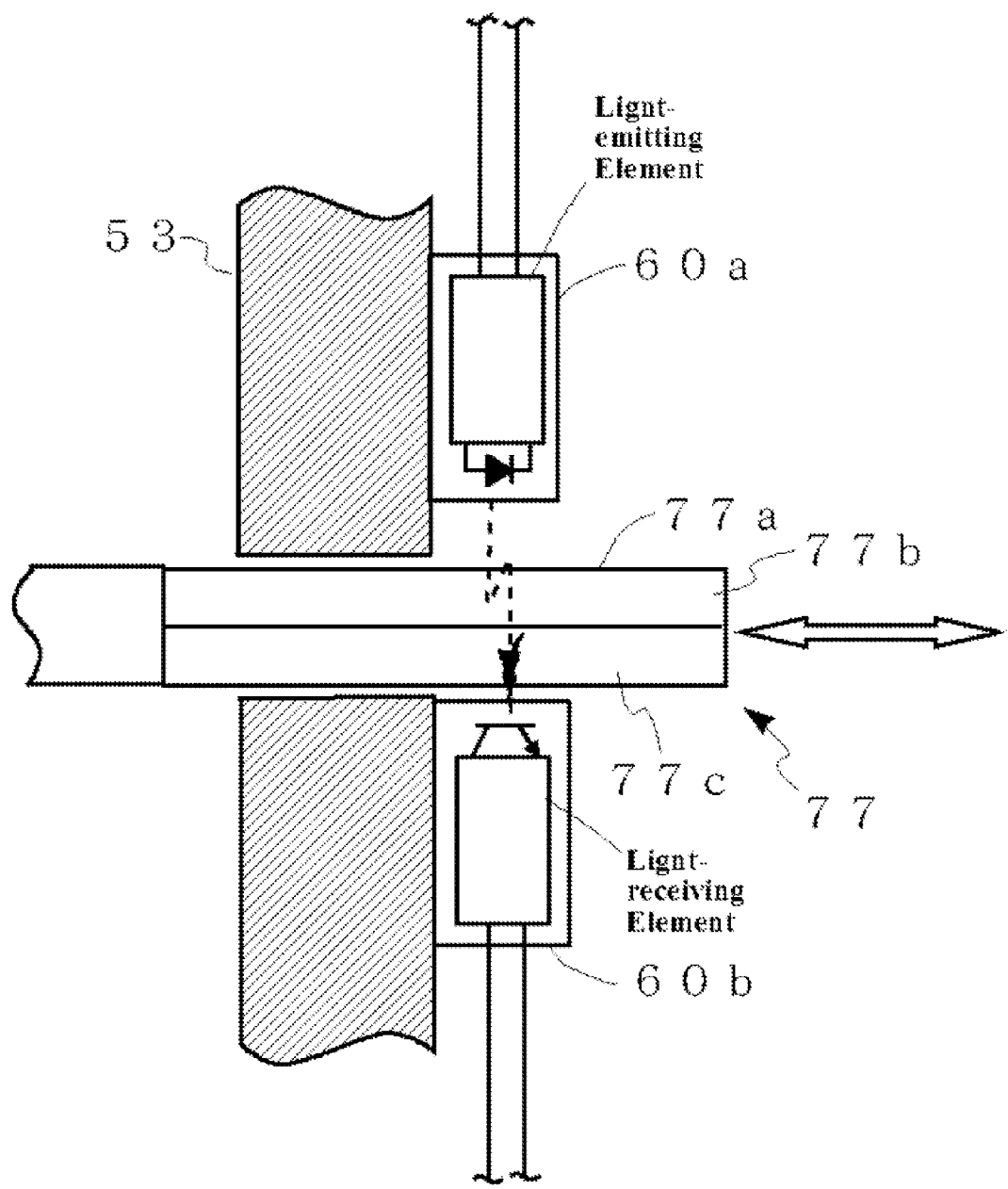
FIG. 13 is a schematic view showing a detection principle on the basis of transmitted light.

In this embodiment, the principle of the detecting portion 60 detecting the detection element 77 is not restricted. Changes of the magnetic force, the amount of light, the sound volume, the inductance (L), and the capacitance (C) may be used. More specifically, if the detecting portion 60 comprises a magnetic sensor, the detecting portion 60 may detect the detection element 77 using a magnetic force from the magnetic metal substance 77*b* in the detection element 77. If the detecting portion 60 comprises a light-emitting element and a light-receiving element as shown in FIG. 12, the detecting portion 60 may detect the detection element 77 using light from the light-emitting element reflected by the reflective surface 77*a* of the detection element 77. Likewise, although not shown, if the detecting portion 60 comprises an ultrasonic wave-emitting element and an ultrasonic wave-receiving element, the detecting portion 60 may detect the detection element 77 using ultrasonic waves from the ultrasonic wave-emitting element reflected by the reflective surface 77*a* of the detection element 60. Further, if the detecting portion 60 comprises a light-emitting element and a light-receiving element, the light-emitting element 60*a* and the light-receiving element 60*b* may be opposed across the detection element 77 as shown in FIG. 13. The detecting portion 60 may detect the detection element 77 by whether or not light (shown as a broken line in FIG. 13) emitted from the light-emitting element 60*a* toward the light-receiving element 60*b* is blocked by the detection element 77.

Figure 14:
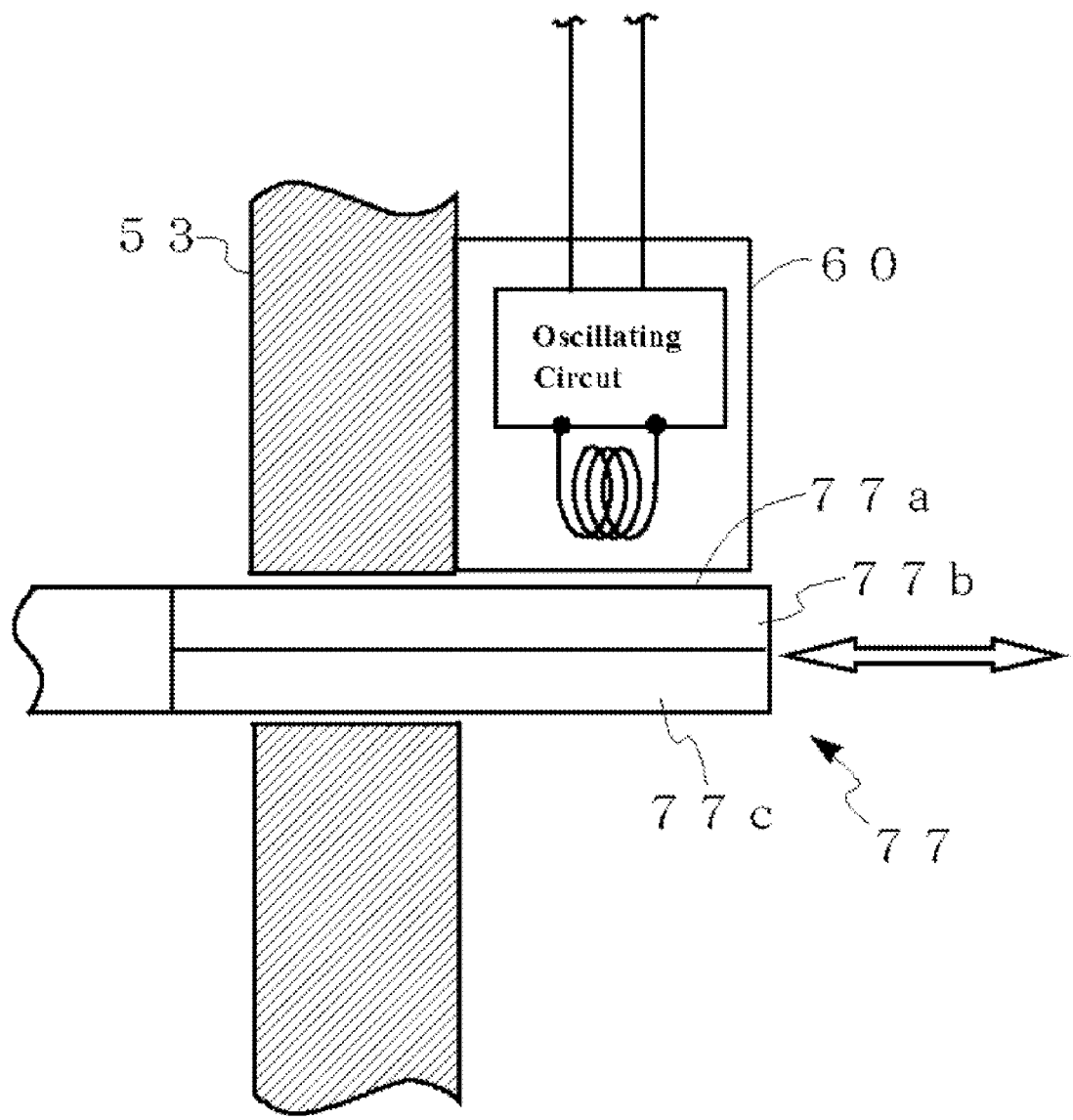
FIG. 14 is a schematic view showing a detection principle on the basis of inductance (L).

Furthermore, if the detecting portion 60 comprises a proximity sensor as shown in FIG. 14, the detecting portion 60 may detect the detection element 77 moving away therefrom using the change of inductance (L) induced by the magnetic metal substance 77*b* in the detection element 77. Moreover, although not shown, if the detecting portion 60 comprises a capacitance (C) sensor, the detecting portion 60 may detect the detection element 77 moving away therefrom using the change of capacitance (C) induced by the electrostatic substance 77*c* in the detection element 77.

What is claimed is:
1. A slave station comprising:
  a transmission device extracting control data from a transmission signal on common data signal lines connected to a control section, the transmission device transmitting a monitoring data signal to the common data signal lines;
  an indicating device;
  an input device; and
  an input-output device transmitting and receiving data to and from the indicating device and the input device,
  the input device comprising a switch portion and a detecting portion, and
  the switch portion comprising:
  a flexible cylindrical member bendable in any directions, the flexible cylindrical member being detachably attached to a housing forming a body, the housing comprising the transmission device, the input-output device, and the detection portion;

a rigid rod member attached to a free end of the flexible cylindrical member;

a flexible rod member extending from the base end of the rigid rod member toward the base end of the flexible cylindrical member through the inside of the flexible cylindrical member; and a guiding member comprising an insertion opening for the flexible rod member, the guiding member holding the flexible rod member while allowing for movement of the flexible rod member in the shaft line direction, wherein a detection element is formed at the end portion of the flexible rod member protruded from the insertion opening of the guiding member, the detection element comprising an electrostatic substance and a magnetic metal substance, and the detection element comprising a reflective surface on the end surface in the shaft line direction or a side surface parallel to the shaft line; and wherein when a force is applied to the rigid rod member in a direction perpendicular to the shaft line of the rigid rod member, the flexible rod member moves in the shaft line direction and the detection portion detects the detection element moving away therefrom.

2. The slave station according to claim 1, wherein the detecting portion is opposed to the end surface of the detection element.

3. The slave station according to claim 1, wherein the detecting portion is opposed to the side surface of the detection element.

4. The slave station according to claim 1, 2, or 3,
wherein the transmission device transmits via the common data signal lines a starting signal followed by a successive pulse signal, address data is assigned to the pulse signal serially for each cycle of the signal, the transmission device counts the address data from the starting signal as the starting point, and when the address data corresponds to self-address data, the transmission device extracts control data overlapped on the successive pulse signal and transmits the monitoring data signal to the common data signal lines.

* * * * *

UNITED STATES PATENT AND TRADEMARK OFFICE
CERTIFICATE OF CORRECTION

Page 1 of 1

PATENT NO. : 9,496,869 B2
APPLICATION NO. : 14/115154
DATED : November 15, 2016
INVENTOR(S) : Saitou et al.

It is certified that error appears in the above-identified patent and that said Letters Patent is hereby corrected as shown below:

In the Specification

Column 4, Line 51: please delete "Nock" and replace it with -- block --
Column 4, Line 53: please delete "Nock" and replace it with -- block --
Column 4, Line 63: please delete "Nock" and replace it with -- block --

Signed and Sealed this
Fourteenth Day of February, 2017

Michelle K. Lee
*Director of the United States Patent and Trademark Office*